(12) United States Patent
Kronholz et al.

(10) Patent No.: US 8,343,826 B2
(45) Date of Patent: Jan. 1, 2013

(54) METHOD FOR FORMING A TRANSISTOR COMPRISING HIGH-K METAL GATE ELECTRODE STRUCTURES INCLUDING A POLYCRYSTALLINE SEMICONDUCTOR MATERIAL AND EMBEDDED STRAIN-INDUCING SEMICONDUCTOR ALLOYS

(75) Inventors: Stephan-Detlef Kronholz, Dresden (DE); Peter Javorka, Radeburg (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/198,209

(22) Filed: Aug. 4, 2011

(65) Prior Publication Data
US 2012/0161250 A1 Jun. 28, 2012

(30) Foreign Application Priority Data
Dec. 28, 2010 (DE) .......................... 10 2010 064 291

(51) Int. Cl.
*H01L 21/8238* (2006.01)
(52) U.S. Cl. ........ 438/217; 438/216; 438/287; 438/289; 438/308; 257/E21.431

(58) Field of Classification Search .................. None
See application file for complete search history.

(56) References Cited

U.S. PATENT DOCUMENTS

| 2009/0075445 A1 | 3/2009 | Kavalieros et al. ............ 438/300 |
| 2010/0109088 A1 | 5/2010 | Ng et al. ........................ 257/369 |
| 2010/0221883 A1 | 9/2010 | Kronholz et al. ............. 438/285 |

FOREIGN PATENT DOCUMENTS
DE 102009010883 A1 9/2010

OTHER PUBLICATIONS

Translation of Official Communication from German Patent Office for German Patent Application No. 10 2010 064 291.6 dated Sep. 6, 2011.

*Primary Examiner* — Zandra Smith
*Assistant Examiner* — Khanh Duong
(74) *Attorney, Agent, or Firm* — Williams, Morgan & Amerson, P.C.

(57) ABSTRACT

When forming sophisticated high-k metal gate electrode structures in an early manufacturing stage on the basis of a silicon/germanium semiconductor alloy for adjusting appropriate electronic conditions in the channel region, the efficiency of a strain-inducing embedded semiconductor alloy, such as a silicon/germanium alloy, may be enhanced by initiating a crystal growth in the silicon material of the gate electrode structure after the gate patterning process. In this manner, the negative strain of the threshold voltage adjusting silicon/germanium alloy may be reduced or compensated for.

20 Claims, 4 Drawing Sheets

METHOD FOR FORMING A TRANSISTOR COMPRISING HIGH-K METAL GATE ELECTRODE STRUCTURES INCLUDING A POLYCRYSTALLINE SEMICONDUCTOR MATERIAL AND EMBEDDED STRAIN-INDUCING SEMICONDUCTOR ALLOYS

BACKGROUND OF THE INVENTION

1. Field of the Invention

Generally, the present disclosure relates to the fabrication of sophisticated integrated circuits including transistor elements comprising high-k metal gate electrode structures.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions representing an interface that is formed by highly doped regions, referred to as drain and source regions, and by a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the electronic characteristics of the channel regions, such as dopant concentration, band gap, the mobility of the charge carriers, and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the base material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. It turns out that decreasing the channel length requires an increased capacitive coupling between the gate electrode and the channel region to avoid the so-called short channel behavior during transistor operation. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with thermal design power requirements for many types of integrated circuits.

Therefore, replacing silicon dioxide based dielectrics, at least in part, as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would otherwise be obtained by an extremely thin silicon dioxide layer.

Additionally, transistor performance may be increased by providing an appropriate conductive material for the gate electrode so as to replace the usually used polysilicon material at least in the vicinity of the gate dielectric material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals may be formed so as to connect to the high dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration and the performance characteristics thereof has to be guaranteed when using metal-containing electrode materials.

In addition to providing sophisticated high-k metal gate electrode structures, other mechanisms are typically implemented in transistors in order to increase the overall performance, for instance, in terms of the electronic characteristics of the channel region. For example, it is well known that the charge carrier mobility in the channel region may be efficiently modified by inducing a strained state therein, which may be accomplished by various strain-inducing mechanisms, such as providing an embedded strained semiconductor material in the drain and source regions, thereby inducing a desired strain component in the channel region.

For example, silicon/germanium is frequently used in P-channel transistors in the drain and source areas in order to induce a compressive strain in the channel region of the P-channel transistor. The approach of providing an embedded strain-inducing semiconductor material, such as a silicon/germanium material, in the active regions of transistors is typically implemented by forming cavities in the active regions adjacent to the gate electrode structures and by providing the semiconductor alloy, such as the silicon/germanium alloy, by using selective epitaxial growth techniques, wherein the material composition and the offset of the semiconductor alloy substantially determine the finally obtained strain in the channel region of the transistor. Generally, the incorporation of a strain-inducing silicon/germanium alloy into the active region of the P-channel transistors is a very promising approach, which essentially contributes to a gain in performance of sophisticated transistors. In combination with sophisticated gate electrode structures, which comprise a high-k dielectric material in combination with a metal-containing electrode material, however, a significant gain in performance is no longer observed, which is assumed to be caused by the interaction of a threshold adjusting mechanism of the P-channel transistor with the strain-inducing semiconductor alloy in the drain and source areas. That is, typically in sophisticated approaches, the threshold voltage adjustment of complex high-k metal gate electrode structures may be accomplished in an early manufacturing stage, i.e., upon forming the gate electrode structures, which may require the incorporation of a specific channel semiconductor material at a surface of the active regions of one type of transistor in order to achieve a required offset of the band gaps between P-channel transistors and N-channel transistors, since providing work function adjusting metal species in the gate electrode structures of transistors of different conductivity type may not be sufficient. The additional channel semiconductor material is frequently provided in the form of a semiconductor alloy, such as a silicon/germanium alloy, wherein the thickness of the additional semiconductor material and the material composition may have a significant influence on the finally achieved threshold voltage of the transistor under consideration. For example, a silicon/germanium alloy is frequently used in P-channel transistors as a surface layer of the active regions on which the high-k metal gate electrode structure is formed, wherein, in combination with a specific configuration of the gate insulation layer and the subsequent metal-containing electrode material, the thickness of the surface layer and the composition thereof, i.e., the germanium concentration, determine the resulting transistor characteristics. It is believed, however, that the channel semiconductor alloy may increasingly interact with the strain-inducing semiconductor alloy provided in the drain and source areas, in particular when reduced transistor dimensions are to be implemented.

Figure 1A:
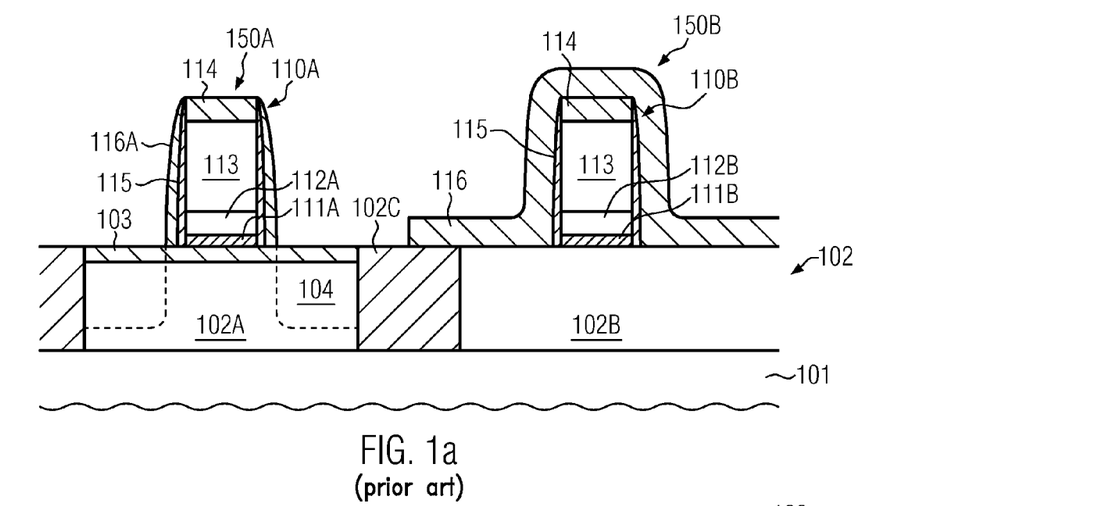
FIGS. 1a-1b schematically illustrate cross-sectional views of a semiconductor device during various manufacturing stages in forming sophisticated transistors including a high-k metal gate electrode structure and a threshold voltage adjusting semiconductor alloy in combination with a strain-inducing silicon/germanium alloy in one type of transistor, according to conventional process strategies.
Figure 1B:
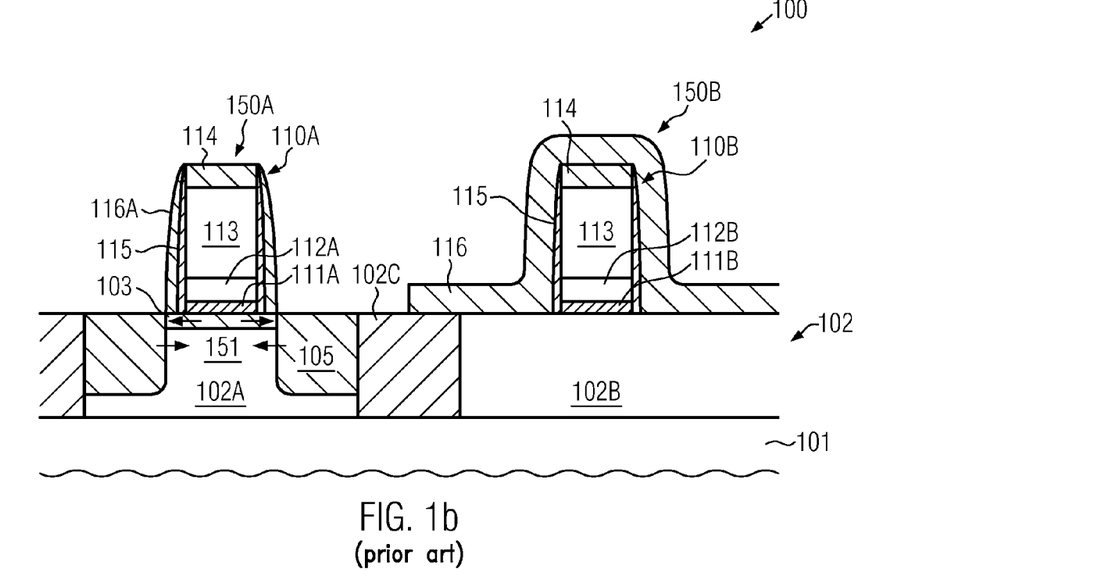

With reference to FIGS. 1a-1b, a typical process flow for forming transistors including sophisticated high-k metal gate electrode structures is described in order to identify the problems involved in this conventional process strategy.

FIG. 1a schematically illustrates a cross-sectional view of a semiconductor device 100 in an early manufacturing stage. As illustrated, the device 100 comprises a substrate 101, above which is formed a semiconductor layer 102 that, in turn, is divided into a plurality of active regions 102A, 102B by means of an isolation structure 102C. In the example shown, the active region 102A corresponds to a P-channel transistor 150A, while the active region 102B corresponds to an N-channel transistor 150B. It should be appreciated that, in this context, an active region is to be understood as a semiconductor region in and above which one or more transistor elements are to be formed. As discussed above, the active region 102A comprises a channel semiconductor material 103 in the form of a silicon/germanium alloy, i.e., in the form of a crystalline silicon/germanium mixture, wherein the layer 103 may represent a surface layer that in the manufacturing stage shown covers the entire active region 102A. Typically, a thickness of the layer 103 may be in the range of 8-50 nm, while a germanium concentration may be in the range of 25 to approximately 30 atomic percent. As discussed before, the material composition, i.e., the germanium concentration, and the thickness of the layer 103 may significantly influence the finally obtained threshold voltage of the transistor 150A. Moreover, the transistor 150A comprises a gate electrode structure 110A, while the transistor 150B comprises a gate electrode structure 110B. The gate electrode structures 110A, 110B represent sophisticated high-k metal gate electrode structures and thus comprise gate insulation layers 111A, 111B, respectively, and metal-containing electrode materials 112A, 112B, respectively. Moreover, an amorphous silicon material 113 is formed above the respective metal-containing electrode materials 112A, 112B, followed by a cap layer or layer system 114, for instance comprised of silicon nitride, silicon dioxide and the like. Furthermore, both gate electrode structures 110A, 110B may comprise a sidewall liner or spacer 115 in order to preserve integrity of the sensitive materials of the gate electrode structures, wherein typically silicon nitride and the like may be used. Furthermore, the gate electrode structure 110A comprises a sidewall spacer 116A, which may define the lateral offset of cavities 104 to be formed in the active region 102A. On the other hand, the gate electrode structure 110B is covered by a spacer layer 116 in order to protect the gate electrode structure 110B and the active region 102B during the further processing.

The semiconductor device 100 as illustrated in FIG. 1a may be formed on the basis of the following processes. The isolation structure 102C may be formed on the basis of sophisticated lithography, etch, deposition and planarization techniques in order to implement the structure 102C in the form of a shallow trench isolation. Consequently, by forming the shallow trench isolation within the initial semiconductor layer 102, the active regions 102A, 102B are laterally delineated. After or prior to forming the isolation structure 102C, appropriate dopant species are incorporated into the active regions 102A, 102B by using well-established masking regimes and implantation techniques. Furthermore, a mask may be formed so as to cover the active region 102B in order to apply a selective epitaxial growth process for forming the surface layer 103 in the form of a silicon/germanium alloy. To this end, an appropriate dielectric material, such as silicon dioxide, is formed on or above the active regions 102A, 102B and is then selectively removed from the active region 102A. If desired, a certain recess may be formed in the active region 102A in order to provide a substantially planar surface topography after depositing the material of the layer 103, as for instance shown in FIG. 1a. To this end, any well-established etch techniques may be applied. Thereafter, the material of the layer 103 is deposited by using well-established selective epitaxial growth techniques in which process parameters, such as flow rates of precursor gases and the like, are appropriately selected such that a desired material composition is obtained and a material deposition is substantially restricted to exposed crystalline surface areas, while a significant material deposition on dielectric surface areas is suppressed. In order to provide an appropriate band gap offset in the upper portion of the active region 102A compared to the active region 102B, typically a high germanium concentration is desirable, wherein presently available deposition recipes may allow germanium concentrations of up to approximately 30 atomic percent. Consequently, upon depositing the layer 103, the mismatch in the natural lattice constants between the material of the layer 103 and the silicon material of the active region 102A may result in a certain degree of strain within the layer 103 and also in the material of the active region 102A in the vicinity of the layer 103.

After the deposition of the material 103, the mask formed above the active region 102B is removed and appropriate material layers are formed in order to provide the gate insulation layers 111A, 111B and the metal-containing electrode materials 112A, 112B. To this end, sophisticated process strategies are applied wherein, if required, a very thin conventional dielectric material, such as silicon oxynitride, may be formed, followed by the deposition of a high-k dielectric material such as a hafnium oxide-based material and the like. Moreover, electrode-containing materials may be deposited, for instance in the form of titanium nitride and the like, possibly in combination with additional work function adjusting metal species, such as aluminum, lanthanum and the like, wherein additional heat treatments may be performed so as to induce diffusion of any work function adjusting species and thermally stabilize the resulting material configuration. Consequently, after any such complex deposition and patterning regime, the gate insulation layers 111A, 111B and the electrode materials 112A, 112B are provided with desired electronic characteristics complying to the requirements of the transistors 150A, 150B, respectively. Thereafter, the amorphous silicon material 113 is deposited, thereby providing the material 113 with a substantially stress neutral behavior. Furthermore, the dielectric cap layer or layer system 114 is formed, possibly in combination with any additional sacrificial material, as required for patterning the resulting material layer stack. Thereafter, a complex lithography and etch sequence is applied in order to form the gate electrode structures 110A, 110B with the desired lateral dimensions, wherein a gate length may be 50 nm and less in sophisticated applications. It should be appreciated that the gate length is to be understood as the horizontal extension of the electrode materials 112A, 112B along the current flow direction, which is the horizontal direction in FIG. 1a. Next, the protective liner or spacer materials 115 are deposited, for instance by sophisticated low pressure chemical vapor deposition (CVD), multi-layer deposition techniques and the like, followed by a patterning of the layer in order to obtain the liners 115. Next, the spacer layer 116 is deposited and is locally anisotropically etched in order to form the spacer 116A, while the layer 116 is substantially preserved above the active region 102B. Thereafter, the cavities 104 are formed in the active region 102A, while using the layer 116 and possibly any resist material as an etch mask for the transistor 150B. The etch process for forming the cavities 104 may be performed on the basis of well-established plasma-based etch processes, wet chemical etch processes and the like.

FIG. 1b schematically illustrates the semiconductor device 100 in a further advanced manufacturing stage. As illustrated, a strain-inducing silicon/germanium alloy 105 is formed in the cavities 104 (FIG. 1a), which is accomplished by applying selective epitaxial growth techniques. As previously discussed, although a high germanium concentration may be desirable in view of increasing the mismatch of the natural lattice constants between the material 105 and the remaining material of the active region 102A, in presently available selective epitaxial growth techniques, the germanium concentration may not be arbitrarily increased. It rather appears that germanium concentrations above 25 percent are difficult to become realized when forming the embedded strain-inducing silicon/germanium alloy 105. Moreover, in many cases, it is advantageous to provide a varying germanium concentration, for instance a graded germanium concentration which may be advantageous for the further processing of the device 100, for instance in terms of forming metal silicide regions in the material 105, reducing the number of lattice defects upon forming the material 105 and the like. Consequently, frequently the material 105 may have a maximum germanium concentration that is less than the germanium concentration in the layer 103, which, however, is believed to cause a significant reduction of the efficiency of the strain-inducing mechanism of the material 105. Without intending to restrict the present application to the following explanation, it is believed that a significant strain component may exist in the layer 103 and thus also in the neighboring silicon area of the channel region 151, wherein, however, the strain component is inversely oriented compared to the strain component of the laterally adjacent silicon/germanium material 105. Consequently, a significant part of the strain obtained in the channel region 151 by means of the embedded material 105 may be compensated for or even over-compensated for by the strain induced by the material 103. On the other hand, a reduction of the germanium concentration in the layer 103, which would reduce the adverse effect on the overall strain conditions in the channel region 151, is less desirable since this would significantly influence the resulting threshold voltage of the transistor 150A. Similarly, a reduction of the thickness of the layer 103 would also result in a significant change of the finally obtained threshold voltage. Consequently, a change in one or both of these parameters of the layer 103 would require a complete redesign of the semiconductor device 100. On the other hand, an increase of the germanium concentration in the material 105 is difficult to achieve on the basis of currently available selective epitaxial deposition recipes.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which, for a given configuration of a threshold voltage adjusting semiconductor alloy, superior strain conditions may be achieved by using the semiconductor-based electrode material of the gate electrode structure as a strain-inducing source that may at least partially compensate for the strain induced by the threshold voltage adjusting semiconductor alloy. To this end, an increased degree of crystallization may be initiated after patterning the gate electrode structures, thereby reducing the average lattice constant and thus the volume of the semiconductor material, which may thus compensate for the strain induced by the semiconductor alloy formed below the gate electrode structure. The reduction in volume may be initiated by providing at least a portion of the semiconductor material in the form of a polycrystalline material, the crystalline structure of which may further be improved during an anneal process which, for instance, may be performed prior to depositing the strain-inducing semiconductor alloy. For example, conventionally, a corresponding heat treatment at approximately 850° C. is performed after forming the cavities in the active region and prior to depositing the silicon/germanium alloy. In this heat treatment, any native oxides may be vaporized in order to provide superior surface conditions for the subsequent selective epitaxial growth process. On the other hand, during this treatment, the amorphous silicon material in the gate electrode structure may substantially not alter its crystalline state, which has conventionally been considered as advantageous in order to provide a substantially stress neutral behavior of the amorphous silicon material. According to the principles disclosed herein, the semiconductor material in the gate electrode structure may be efficiently used as a source for inducing additional strain in order to significantly improve the strain conditions in the channel region.

One illustrative method disclosed herein comprises forming a threshold voltage adjusting semiconductor alloy in a semiconductor region of a transistor. The method further comprises forming a gate electrode structure on the threshold voltage adjusting semiconductor alloy, wherein the gate electrode structure comprises a high-k gate dielectric material, a metal-containing electrode material and a semiconductor electrode material. Additionally, the method comprises forming at least one cavity in the semiconductor region in the presence of the gate electrode structure. Moreover, an anneal process is performed so as to reduce a volume of at least the semiconductor electrode material. Furthermore, at least a portion of the at least one cavity is filled with a strain-inducing semiconductor alloy so as to provide a performance enhancing strain in a channel region of the transistor.

A further illustrative method disclosed herein relates to forming a transistor of a semiconductor device. The method comprises forming a silicon/germanium alloy as a surface layer of an active region, wherein the silicon/germanium alloy has a first maximum germanium concentration. The method further comprises forming a gate electrode structure on the surface layer and forming a strain-inducing silicon/germanium alloy in the active region, wherein the strain-inducing silicon/germanium alloy has a second maximum germanium concentration that is less than the first germanium concentration. Furthermore, the method comprises annealing the gate electrode structure so as to reduce a strain effect induced by the surface layer in a channel region of the transistor.

One illustrative semiconductor device disclosed herein comprises an active region that comprises, at a surface portion thereof, a threshold voltage adjusting semiconductor alloy. The semiconductor device further comprises a gate electrode structure formed at least on the surface portion of the active region and comprising a high-k dielectric material, a metal-containing electrode material formed above the high-k dielectric material and a polycrystalline semiconductor material formed above the metal-containing electrode material. Furthermore, the semiconductor device comprises a strain-inducing semiconductor alloy that is formed in at least a portion of drain and source regions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure contemplates manufacturing techniques and semiconductor devices in which the gate electrode structure may be efficiently used as a strain compensation source in order to provide superior strain conditions in the channel region of a transistor which comprises a threshold voltage adjusting semiconductor alloy in combination with a strain-inducing semiconductor alloy. To this end, the crystallinity of a semiconductor material of the gate electrode structure may be improved, i.e., the number and/or the size of any crystalline grains may be increased, which may result in a reduction of the volume, which in turn results in a certain strained state. To this end, at least a portion of the semiconductor material, such as the silicon material, may be provided in the form of a polycrystalline material as, for instance, is also used in many less sophisticated semiconductor devices in which silicon dioxide based gate dielectric materials are used in combination with a polycrystalline silicon material. Consequently, similar deposition recipes may be applied in combination with sophisticated high-k dielectric materials and metal-containing electrode materials in order to provide at least locally a certain polycrystalline state of the semiconductor material, which may then be further improved in a subsequent anneal process, thereby obtaining the desired crystal growth and thus volume reduction, which may result in a stress transfer into the channel region, which comprises the threshold voltage adjusting semiconductor alloy. In this manner, the non-desired internal strain of the channel semiconductor alloy, such as a silicon/germanium alloy, may be compensated for or at least significantly reduced so that the actual strain-inducing effect of an embedded strain-inducing semiconductor alloy, such as a silicon/germanium alloy, may become more effective compared to conventional strategies so that a significant gain in performance may be achieved compared to conventional strategies, as previously described with reference to FIGS. 1a and 1b, even if a given thickness and maximum germanium concentration for the channel semiconductor alloy is to be applied.

With reference to FIGS. 2a-2f, further illustrative embodiments will now be described in more detail, wherein reference may also be made to FIGS. 1a-1b, if appropriate.

Figure 2A:
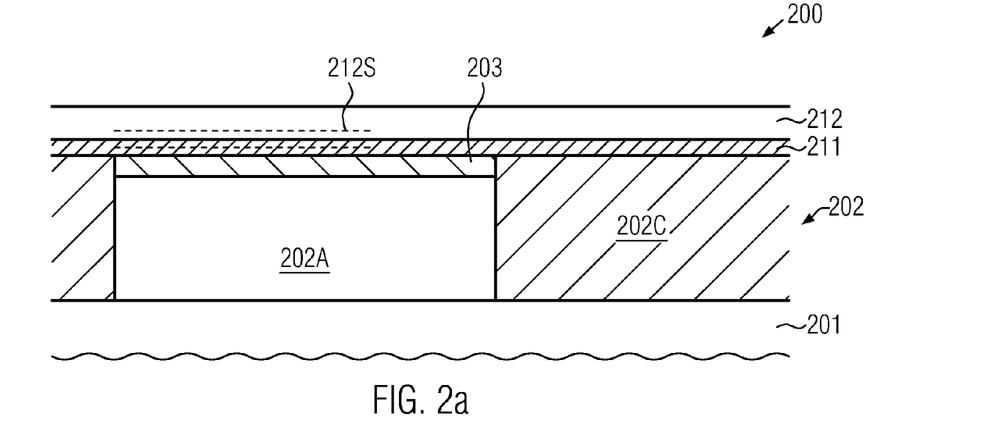
FIGS. 2a-2f schematically illustrate cross-sectional views of a semiconductor device during various manufacturing stages in forming a threshold voltage adjusting semiconductor alloy and a strain-inducing semiconductor material with superior strain conditions, for instance in a P-channel transistor, by using the gate electrode structure as a strain compensation source, according to illustrative embodiments.

FIG. 2a schematically illustrates a cross-sectional view of a semiconductor device 200 in an early manufacturing stage. As shown, the device 200 may comprise a substrate 201 above which is provided a semiconductor layer 202, such as a silicon layer, a silicon/germanium layer and the like. It should be appreciated that a buried insulating layer (not shown) may be positioned between the substrate 201 and the semiconductor layer 202 if a silicon-on-insulator (SOI) architecture is to be used. Moreover, the semiconductor layer 202 may comprise appropriately dimensioned isolation structures 202C in order to laterally delineate a plurality of active regions, wherein, for convenience, an active region 202A is illustrated, which represents the active region for a transistor that requires a threshold voltage adjusting semiconductor material 203 in combination with a strain-inducing semiconductor material that is still to be formed in the active region 202A. For example, in some illustrative embodiments, the layer 203 may have a thickness of approximately 8-20 nm with a maximum germanium concentration of approximately 30 percent or less.

Furthermore, in the manufacturing stage shown, a gate insulation layer 211 is formed above the active region 202A, followed by a metal-containing electrode material 212, wherein the layer 211 and/or the layer 212 may comprise a work function adjusting metal species 212S, for instance in the form of aluminum and the like. The gate insulation layer 211 may be provided so as to include a high-k dielectric material, such as any appropriate metal oxide, for instance hafnium oxide and the like, wherein, if required, a thin oxide-based material may be formed directly on or in the surface layer 203. The layer 212 may be provided in the form of titanium nitride or any other appropriate conductive and metal-containing electrode material, which may generally provide the required work function and electronic characteristics and which may have a desired thermal stability. The layers 211 and 212 may be formed on the basis of any appropriate process strategy, for instance by forming the layer 211 and applying an appropriate deposition and patterning strategy, possibly in combination with any thermal treatments, in order to appropriately adjust the work function and, thus, in combination with the layer 203, the threshold voltage of a transistor still to be formed in and above the active region 202A.

Figure 2B:
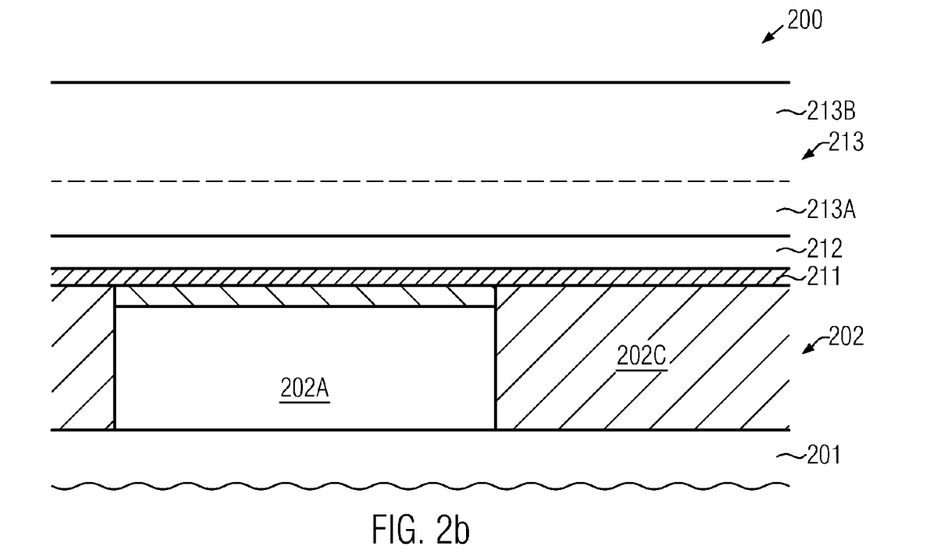

FIG. 2b schematically illustrates the device 200 in a further advanced manufacturing stage. As shown, a layer of a semiconductor material 213 may be formed above the metal-containing electrode material 212, wherein, in some illustrative embodiments, the material 213 may be provided in a polycrystalline state. For example, the layer 213 may comprise a silicon material in a polycrystalline state, which may be formed on the basis of appropriately selected deposition parameters, for instance on the basis of low pressure CVD at elevated temperatures in order to provide a polycrystalline structure upon depositing the silicon material. In other cases, the layer 213 may comprise a polycrystalline silicon/germanium material, for instance with a germanium concentration of several atomic percent, up to 30 atomic percent or higher. In still other illustrative embodiments, the layer 213 may comprise two or more sub-layers, such as sub-layers 213A, 213B, which may differ in material composition and/or crystalline state. For example, the sub-layer 213A may be provided in the form of a substantially amorphous semiconductor material, such as a silicon material, while the sub-layer 213B may have a substantially polycrystalline structure in order to initiate a further crystalline growth during the subsequent processing of the device 200. To this end, the layer 213 may be deposited on the basis of two different deposition parameters, for instance two different temperatures and the like, in order to provide the sub-layers 213A, 213B. For example, providing the sub-layer 213A in the form of a substantially amorphous material may result in different patterning conditions during the subsequent patterning of the gate layer stack. Consequently, in this case, similar process conditions may be encountered, at least at a final phase of the gate patterning process, as are also established in the sophisticated conventional approach, as previously described with reference to FIGS. 1a and 1b. On the other hand, the sub-layer 213B may act as a "seed" material during a subsequent anneal process in order to initiate a desired crystalline growth.

Figure 2C:
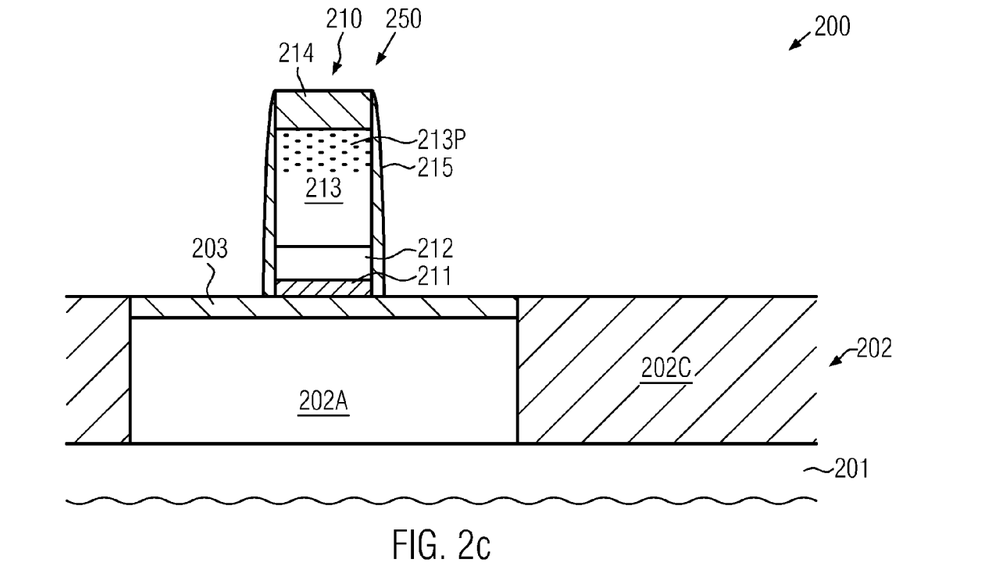

FIG. 2c schematically illustrates the semiconductor device 200 in a further advanced manufacturing stage. As illustrated, a gate electrode structure 210 of a transistor 250 is formed on a portion of the layer 203, which thus represents a surface layer of the active region 202A. The gate electrode structure 210 may be provided with any appropriate lateral dimensions, for instance based on a critical gate length of 50 nm and less, as is also previously discussed. Moreover, a protective liner material 215 may be formed on sidewalls of the layers 213, 212 and 211, thereby encapsulating, in combination with a cap layer or layer system 214, these sensitive gate materials. It should be appreciated that, if required, the protective liner or spacer 215 may also comprise additional spacer elements in order to appropriately define a lateral offset of cavities to be formed in the active region 202A in a later manufacturing stage. Moreover, as shown, the semiconductor material 213 of the gate electrode structure 210 may comprise, at least locally, polycrystalline areas, as indicated by 213P, in order to achieve a further crystallization of the material 213 in a later manufacturing step.

The gate electrode structure 210 as illustrated in FIG. 2c may be formed on the basis of any appropriate lithography and etch strategy, as, for instance, also discussed above with reference to the semiconductor device 100. Similarly, the sidewall spacer structure 215 may be formed, as discussed above. In some illustrative embodiments, after patterning the gate electrode structure 210, an appropriate anneal process may be applied in order to initiate a further crystal growth in the material 213, thereby reducing the volume of the material 213 so that the material 213 may tend to reduce its volume and thus transfer a certain stress component into a central portion of the layer 203. In other illustrative embodiments, a corresponding anneal process may be performed after patterning the active region 202A.

Figure 2D:
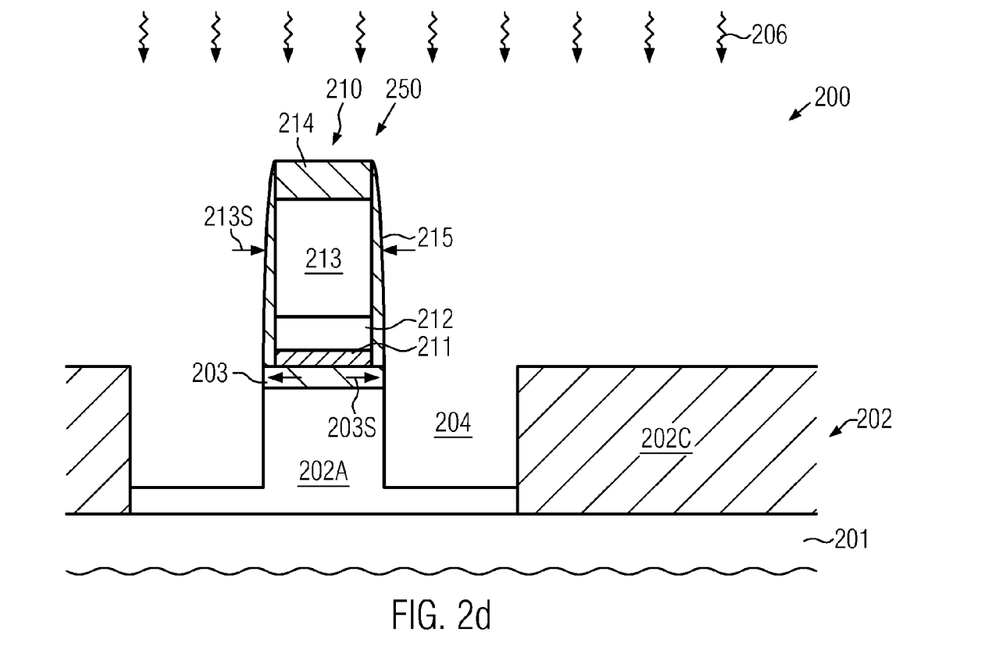

FIG. 2d schematically illustrates the semiconductor device 200 in a further advanced manufacturing stage. As shown, cavities 204 may be provided in the active region 202A, which may be accomplished by applying any appropriate etch strategy. For example, plasma assisted etch recipes, wet chemical etch recipes or a combination thereof may be used in order to form the cavities 204 so as to have any desired shape and size. Consequently, during the formation of the cavities 204, also the layer 203 may be patterned, which may result in a certain relaxation of its internal strain condition, wherein, however, a significant strain 203S may still exist in the layer 203. For example, in the case of a silicon/germanium material formed on a silicon base material in the active region 202A, a certain compressive strain 213S may be present which may thus result in a certain tensile strain component in the remaining portion of the active region 202A. Consequently, in this situation, in some illustrative embodiments, an anneal process 206 may be applied, for instance at temperatures of approximately 800° C. or higher, such as approximately 850° C., with a process time of several seconds to several tenths of seconds, in which, for instance, any native undesired oxide residues on exposed crystalline surface areas within the cavities 204 may be removed, while at the same time a certain regrowth or growth of crystal grains in the material 213 may be initiated. Consequently, an increased degree of crystallinity in the material 213 may result in a reduced volume compared to a stage of less order the material 213 may tend to reduce its volume, which in turn may induce a specific type of strain in the layer 203, thereby counteracting the strain component 203S. Thus, the gate electrode structure 210 may be used as a source for reducing or compensating for the strain component 203S in the layer 203. As previously discussed, upon providing at least a portion of the material 213 in a polycrystalline state, the efficiency of a further crystallization of the material 213 during the anneal process 206 may be enhanced, thereby enabling the usage of a moderately low temperature and a reduced process time, which may thus not unduly affect the electronic characteristics of the gate electrode structure 210, which may have been previously established when providing the materials 211 and 212 (FIG. 2c). In other cases, if a sufficient thermal stability of these materials has been established during the further processing, the anneal process 206 may be performed for several minutes and/or at higher process temperatures of approximately 900° C. and higher.

Figure 2E:
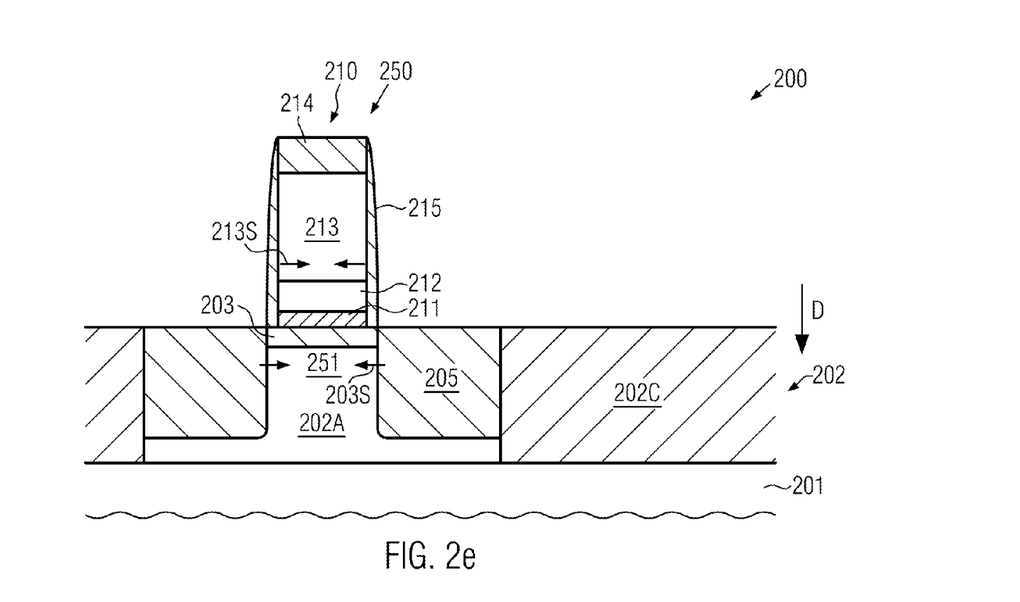

FIG. 2e schematically illustrates the semiconductor device 200 in a further advanced manufacturing stage. In this stage, a strain-inducing semiconductor alloy 205, in one illustrative embodiment a germanium-containing semiconductor alloy, is formed in the cavities 204 (FIG. 2d). To this end, any well-established selective epitaxial growth recipe may be applied, as is also previously discussed with reference to the semiconductor device 100. The semiconductor alloy 205, when comprising germanium, may have a maximum germanium concentration that is less than a maximum germanium concentration of the layer 203, for instance in order to comply with other transistor characteristics, while, in some illustrative embodiments, the germanium concentration in the material 205 may even vary along a depth direction, indicated as D, when required by the overall transistor characteristics. Even in this case a significant strain may be induced in a channel region 251 by the material 205, since a negative effect of the layer 203 may be efficiently compensated for or at least be significantly reduced by the strain component 213S of the semiconductor material 213. Consequently, for given electronic characteristics of the layer 203, a significant gain in performance of the transistor 250 may be obtained compared to a conventional transistor, for instance as described with reference to the device 100, even if otherwise the same transistor configuration is used.

Figure 2F:
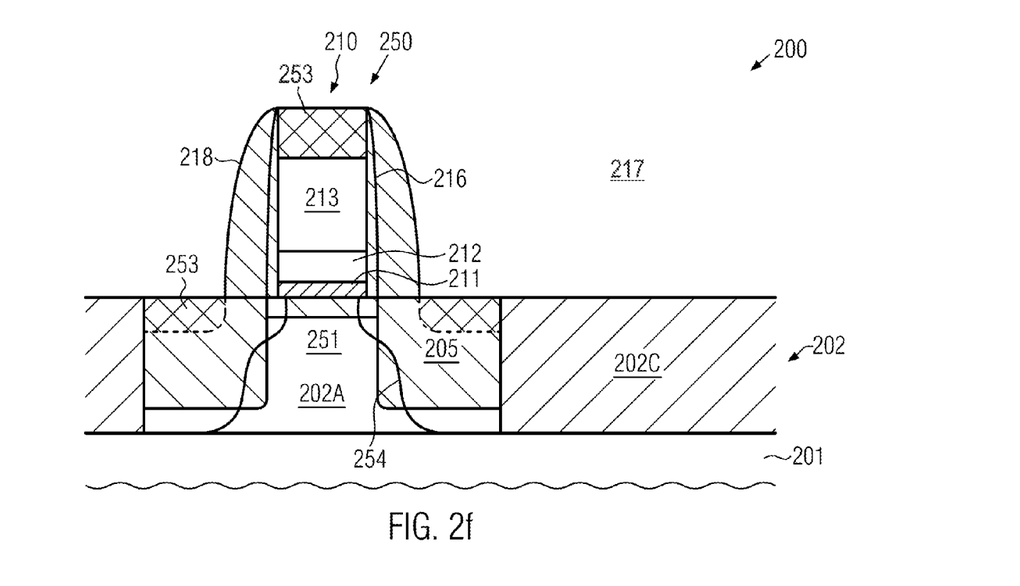

FIG. 2f schematically illustrates the semiconductor device 200 in a further advanced manufacturing stage. As illustrated, the transistor 250 comprises drain and source regions 254, which are at least partially formed within the strain-inducing material 205. Furthermore, a spacer structure 218, possibly in combination with an additional spacer structure 216 or in combination with the structure 215 (FIG. 2c) may be provided and may be used to adjust the lateral and vertical dopant profile of the drain and source regions 254. Furthermore, in some illustrative embodiments, a semiconductor compound 253, for instance in the form of a metal silicon/germanium compound, may be provided in order to enhance contact resistivity and overall conductivity of the drain and source regions 254. Furthermore, in some illustrative embodiments, also a metal compound may be formed from a portion of the semiconductor material 213, for instance in the form of a metal silicide, thereby also enhancing the overall conductivity of the gate electrode structure 210.

The transistor 250 as shown in FIG. 2f may be formed on the basis of any appropriate process strategy. For example, the drain and source regions 254 may be formed on the basis of any appropriate masking regime and implantation techniques, wherein the spacer structure 218, possibly in combination with the structure 216, may be used as an efficient implantation mask in order to adjust the lateral offset of the drain and source regions 254 and thus the electrically effective length of the channel region 251. After any implantation processes, further anneal processes may be applied in order to activate the dopants and recrystallize implantation-induced damage. Also in this case, depending on the anneal parameters, a certain further crystallization of the material 213 may be accomplished, thereby even further enhancing the overall strain conditions in the channel region 251. In some cases, a silicidation process may be performed, for instance, after removing the dielectric cap layer or layer system 214 (FIG. 2e), which may be accomplished on any appropriate silicidation technique. At the same time, if desired, the metal compound regions 253 may be formed. Next, an interlayer dielectric material 217 may be provided, for instance in the form of silicon nitride, silicon dioxide and the like, which may then be patterned so as to receive contact openings, which may then be filled with any appropriate conductive material.

As a result, the present disclosure provides semiconductor devices and manufacturing techniques in which the strain-inducing effect of an embedded semiconductor alloy, such as a silicon/germanium alloy, may be enhanced by reducing or compensating for the effect of a threshold voltage adjusting semiconductor alloy, which is provided in the channel region of the transistor in order to adapt the overall electronic characteristics. This may be accomplished by using the gate electrode structure, i.e., the semiconductor electrode material contained therein, as an efficient strain-inducing source by improving the crystallinity of this material, which may be accomplished by applying an appropriate anneal process. In some illustrative embodiments, the corresponding anneal process may be applied during the sequence of forming the embedded strain-inducing silicon/germanium alloy, thereby providing a highly efficient overall process flow since no additional process steps are required compared to the conventional process flow, as previously described with reference to FIGS. 1a and 1b. Therefore, sophisticated high-k metal gate electrode structures may be provided in an early manufacturing stage, wherein the negative effect on the strain conditions of the threshold voltage adjusting semiconductor material may be reduced by forming a polycrystalline semiconductor material in the gate electrode structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a threshold voltage adjusting semiconductor alloy in a semiconductor region of a transistor;
   forming a gate electrode structure on said threshold voltage adjusting semiconductor alloy, said gate electrode structure comprising a high-k gate dielectric material, a metal-containing electrode material and a semiconductor electrode material, wherein forming said gate electrode structure comprises providing a work function adjusting species in at least one of said high-k dielectric material and said metal-containing electrode material prior to forming said semiconductor electrode material;
   forming at least one cavity in said semiconductor region in the presence of said gate electrode structure;
   reducing a volume of at least said semiconductor electrode material by performing an annealing process; and
   inducing strain in a channel region of said transistor by filling at least a portion of said at least one cavity with a strain-inducing semiconductor alloy.

2. The method of claim 1, wherein forming said gate electrode structure comprises forming said semiconductor electrode material by forming a layer stack that at least partially comprises a polycrystalline semiconductor material.

3. The method of claim 2, wherein said semiconductor electrode material is deposited as a polycrystalline material.

4. The method of claim 2, wherein forming said layer stack comprises depositing a first sub-layer of said semiconductor electrode material having a substantially amorphous structure and forming a second sub-layer having a polycrystalline structure.

5. The method of claim 1, wherein said threshold voltage adjusting semiconductor alloy and said strain-inducing semiconductor alloy comprise germanium and silicon.

6. The method of claim 5, wherein a germanium concentration in said threshold voltage adjusting semiconductor alloy is higher than a germanium concentration in said strain-inducing semiconductor alloy.

7. The method of claim 5, wherein the germanium concentration in said strain-inducing semiconductor alloy varies along a depth of said at least one cavity.

8. The method of claim 1, wherein said gate electrode structure is formed with a gate length of approximately 50 nm or less.

9. The method of claim 1, further comprising forming a metal compound from at least a portion of said semiconductor electrode material.

10. A method of forming a transistor of a semiconductor device, the method comprising:
    forming a silicon/germanium alloy as a surface layer of an active region, said silicon/germanium alloy having a first maximum germanium concentration;
    forming a gate electrode structure on said surface layer;
    forming a strain-inducing silicon/germanium alloy in said active region, said strain-inducing silicon/germanium alloy having a second maximum germanium concentration that is less than said first germanium concentration; and
    reducing a strain effect induced by said surface layer in a channel region of said transistor by annealing said gate electrode structure.

11. The method of claim 10, wherein forming said gate electrode structure comprises providing a high-k dielectric material in a gate insulation layer of said gate electrode structure.

12. The method of claim 11, wherein forming said gate electrode structure comprises providing a metal-containing electrode material above said gate insulation layer and providing a semiconductor electrode material above said metal-containing electrode material.

13. The method of claim 12, wherein providing said semiconductor electrode material comprises depositing at least a portion of said semiconductor electrode material with a polycrystalline structure.

14. The method of claim 10, wherein said strain effect of said surface layer is reduced prior to forming said strain-inducing semiconductor alloy.

15. The method of claim 10, wherein said strain-inducing semiconductor alloy is formed with a varying germanium concentration along a depth direction.

16. A method, comprising:
    forming a threshold voltage adjusting semiconductor alloy in a semiconductor region of a transistor;
    forming a gate electrode structure on said threshold voltage adjusting semiconductor alloy, said gate electrode structure comprising a high-k gate dielectric material, a metal-containing electrode material and a semiconductor electrode material, said semiconductor electrode material comprising a first sub-layer having a substantially amorphous structure and a second sub-layer having a polycrystalline structure;
    forming at least one cavity in said semiconductor region in the presence of said gate electrode structure;
    reducing a volume of at least said semiconductor electrode material by performing an annealing process; and
    inducing strain in a channel region of said transistor by filling at least a portion of said at least one cavity with a strain-inducing semiconductor alloy.

17. The method of claim 16, further comprising forming a metal compound from at least a portion of said semiconductor electrode material.

18. The method of claim 16, wherein said threshold voltage adjusting semiconductor alloy and said strain-inducing semiconductor alloy comprise germanium and silicon, a germanium concentration in said threshold voltage adjusting semiconductor alloy being higher than a germanium concentration in said strain-inducing semiconductor alloy.

19. A method, comprising:

forming a threshold voltage adjusting semiconductor alloy comprising germanium and silicon in a semiconductor region of a transistor, said threshold voltage adjusting semiconductor alloy having a first germanium concentration;

forming a gate electrode structure on said threshold voltage adjusting semiconductor alloy, said gate electrode structure comprising a high-k gate dielectric material, a metal-containing electrode material and a semiconductor electrode material;

forming at least one cavity in said semiconductor region in the presence of said gate electrode structure;

reducing a volume of at least said semiconductor electrode material by performing an annealing process; and inducing strain in a channel region of said transistor by filling at least a portion of said at least one cavity with a strain-inducing semiconductor alloy comprising germanium and silicon and having a second germanium concentration that is lower than said first germanium concentration.

20. The method of claim 19, wherein said second germanium concentration in said strain-inducing semiconductor alloy varies along a depth of said at least one cavity.

* * * * *